(12) United States Patent
Oh et al.

(10) Patent No.: US 10,204,700 B1
(45) Date of Patent: Feb. 12, 2019

(54) MEMORY SYSTEMS AND METHODS OF OPERATING SEMICONDUCTOR MEMORY DEVICES

(71) Applicant: Samsung Electronics Co., Ltd., Suwon-si, Gyeonggi-do (KR)

(72) Inventors: Yoon-Na Oh, Seongnam-si (KR); Deok-Gu Yoon, Seoul (KR); Sang-Uhn Cha, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/271,600

(22) Filed: Sep. 21, 2016

(51) Int. Cl.
*G11C 29/52* (2006.01)
*G06F 11/07* (2006.01)

(52) U.S. Cl.
CPC ............ *G11C 29/52* (2013.01); *G06F 11/073* (2013.01)

(58) Field of Classification Search
CPC .............................. G11C 29/52; G06F 11/073
See application file for complete search history.

(56) References Cited

U.S. PATENT DOCUMENTS

| 5,903,576 A * | 5/1999 | Yoshiba ........... G01R 31/31926 714/720 |
| 5,956,350 A * | 9/1999 | Irrinki ................ G01R 31/3173 714/718 |
| 6,097,206 A * | 8/2000 | Takano .................. G11C 29/56 324/762.01 |
| 7,266,028 B1 * | 9/2007 | Ghosh Dastidar ..... G11C 29/44 365/201 |
| 7,624,317 B2 | 11/2009 | Byun et al. |
| 7,900,100 B2 | 3/2011 | Gollub |
| 8,996,953 B2 | 3/2015 | Cordero et al. |
| 9,087,612 B2 | 7/2015 | Franceschini et al. |
| 9,575,125 B1 * | 2/2017 | Andre ..................... G11C 29/10 |
| 2003/0107942 A1 * | 6/2003 | Perner .................. G11C 7/1006 365/230.03 |
| 2008/0082870 A1 | 4/2008 | Park |
| 2008/0091979 A1 | 4/2008 | Okuda |
| 2008/0201620 A1 * | 8/2008 | Gollub ................ G06F 11/1044 714/718 |
| 2009/0044086 A1 * | 2/2009 | Craske ................ G06F 11/1064 714/799 |
| 2015/0261632 A1 | 9/2015 | Kim et al. |

FOREIGN PATENT DOCUMENTS

KR 10-0809070 B1 3/2008

* cited by examiner

*Primary Examiner* — Kyle Vallecillo
(74) *Attorney, Agent, or Firm* — Harness, Dickey & Pierce, P.L.C.

(57) ABSTRACT

A memory system includes a semiconductor memory device and a test device. The semiconductor memory device includes a memory cell array, an error correction circuit and a test circuit. The test device controls a test of the semiconductor memory device, and the test device includes a first fail address memory and a second fail address memory. The test circuit performs a first test on the memory cell array to selectively record a first test result associated with the first test in the first fail address memory and performs a second test on the memory cell array to record a second test result associated with the second test in the second fail address memory. The test circuit is configured to perform the first test and the second test based on a test pattern data from the test device in a test mode.

18 Claims, 18 Drawing Sheets

× : FAIL CELL
○ : ERASABLE

MEMORY SYSTEMS AND METHODS OF OPERATING SEMICONDUCTOR MEMORY DEVICES

BACKGROUND

Semiconductor memory devices may be classified into non-volatile memory devices such as flash memory devices and volatile memory devices such as dynamic random access memories (DRAMs). High speed operation and cost efficiency of DRAMs make it possible for DRAMs to be used for system memories. Due to the continuing shrink in fabrication design rule of DRAMs, bit errors of memory cells in the DRAMs may rapidly increase.

SUMMARY

Example embodiments relate to memory systems and/or methods of operating semiconductor devices.

Some example embodiments may provide a memory system capable of reducing overhead of test time and increasing test accuracy.

Some example embodiments may provide a method of operating a semiconductor memory device, capable of reducing overhead of test time and increasing test accuracy.

According to example embodiments, a memory system includes a semiconductor memory device and a test device. The semiconductor memory device includes a memory cell array, an error correction circuit and a test circuit. The test device controls a test of the semiconductor memory device, and the test device includes a first fail address memory and a second fail address memory. The test circuit performs a first test on the memory cell array to selectively record a first test result associated with the first test in the first fail address memory and performs a second test on the memory cell array to record a second test result associated with the second test in the second fail address memory, the test circuit configured to perform the first test and the second test based on a test pattern data from the test device in a test mode.

According to example embodiments, in a method of operating a semiconductor memory cell array including a memory cell array and an error correction circuit, a parallel bit test (PBT) is performed on a plurality of memory cells in the memory cell array according to a first scheme to selectively record a first test result in a first fail address memory, a PBT is performed on the plurality of memory cells according to a second scheme to record at least one second test result in a second fail address memory, selected second test result of the at least one second test result is recorded in the first fail address memory, wherein the selected second test result is associated with uncorrectable errors exceeding an error correction capability of the error correction circuit, and a redundancy repair operation is performed on cells of the memory cells, associated with the uncorrectable errors by referring to the first fail address memory.

According to example embodiments, a memory system includes a semiconductor memory device including a memory cell array an error correction circuit and a test circuit. The test circuit is configured to receive test pattern data and perform a first test and a second test on the memory cell array based on the test pattern data. The test circuit is configured to determine a number of errors based on the test pattern data, identify cells associated with the errors and identify locations of the cells associated with the errors, a first test result of the first test being based on the number of errors and the identified cells and a second test result of the second test being based on the identified cells and identified locations.

Accordingly, when a semiconductor memory device employs an error correction code, test time overhead may be reduced while performing PBT and uncorrectable errors may be prevented from being interpreted as correctable errors.

BRIEF DESCRIPTION OF THE DRAWINGS

Example embodiments will be described below in more detail with reference to the accompanying drawings.

FIG. 14 illustrates each bit in a second region in which a second result signal is stored is coded according to at least one example embodiment.

FIG. 15 illustrates the second fail address memory in the memory system in FIG. 2 according to at least one example embodiment.

DETAILED DESCRIPTION OF EXAMPLE EMBODIMENTS

Various example embodiments will be described more fully hereinafter with reference to the accompanying drawings, in which some example embodiments are shown.

Figure 1:
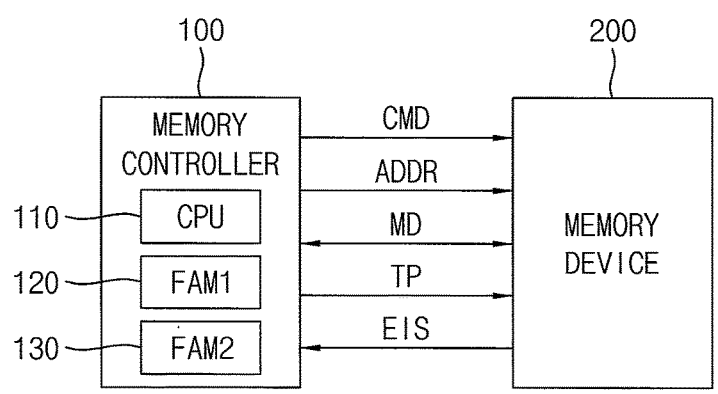
FIG. 1 is a block diagram illustrating a memory system according to at least one example embodiment.

FIG. 1 is a block diagram illustrating a memory system according to at least one example embodiment.

Referring to FIG. 1, a memory system 10 includes a memory controller 100 and at least a semiconductor memory device 200.

The memory controller 100 may control an overall operation of the memory system 10. The memory controller 100 may control an overall data exchange between a host and the semiconductor memory device 200. For example, the memory controller 100 may write data in the semiconductor memory device 200 or read data from the semiconductor memory device 200 in response to a request from the host.

In addition, the memory controller 100 may issue operation commands to the semiconductor memory device 200 for controlling the semiconductor memory device 200.

In some example embodiments, the semiconductor memory device 200 may be a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), or a Rambus dynamic random access memory (RDRAM), etc. In some example embodiments, each of the semiconductor memory device 200 a resistive memory device such as a magnetoresistive random access memory (MRAM), a resistive random access memory (RRAM), a phase change random access memory (PRAM) or a ferroelectric random access memory (FRAM), etc.

The memory controller 100 and the semiconductor memory device 200 may be connected to each other through corresponding command pins (or pads). The memory controller 100 may transmit a command CMD and address ADDR to the semiconductor memory device 200 through corresponding pins and may exchange main data MD with the semiconductor memory device 200 during a normal mode. The memory controller 100 may transmit a test pattern data TP to the semiconductor memory device 200 through corresponding pins and receive error information signal EIS indicating a test result from the semiconductor memory device 200 during a test mode.

When the memory controller 100 perform a test on the semiconductor memory device 200 during the test mode, a central processing unit (CPU) 110 records results of test performed on the semiconductor memory device 200 in a first fail address memory 120 and a second fail address memory 130 and may determine a repair policy of the semiconductor memory device 200 by referring to the recorded test results.

Figure 2:
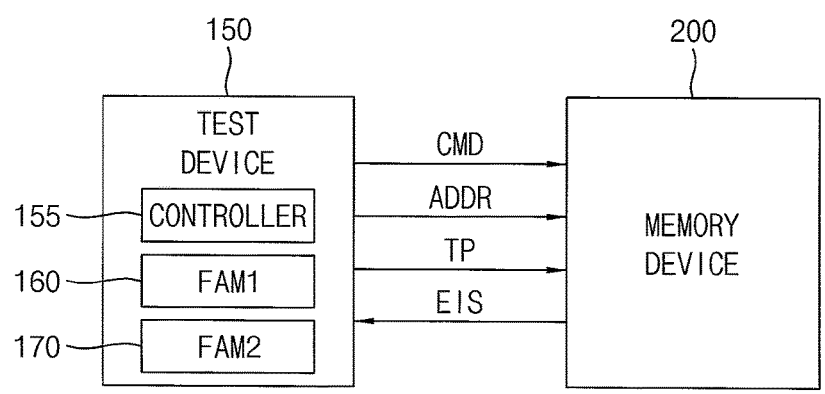
FIG. 2 is a block diagram illustrating a memory system according to at least one example embodiment.

FIG. 2 is a block diagram illustrating a memory system according to at least one example embodiment.

Referring to FIG. 2, a memory system 40 may include a test device 150 and a semiconductor memory device 200. The memory system 40 may be also referred to as a test system.

The test device 150 may include a controller 155, a first fail address memory 160 and a second fail address memory 170.

The test device 150, in a test mode of the semiconductor memory device 200, applies a command CMD indicating the test mode to the semiconductor memory device 200 through a command pin, applies an address ADDR designating memory cells to be tested to the semiconductor memory device 200 through an address pin, and applies a test pattern data TP to the semiconductor memory device 200 through a data pin.

The semiconductor memory device 200 performs a first test and a second test on memory cells in the semiconductor memory device 200 based on the test pattern data TP and may provide the test device 150 with error information signal EIS including a first test result signal and a second result signal which indicate test results. The first test result signal may be selectively recorded in the first fail address memory 160 and the second test result signal may be recorded in the second fail address memory 170. The semiconductor memory device 200 may record the first test result in the fail address memory 160 only when a result of the first test indicates that a number of errors in the memory cells exceeds error correction capability of an error correction circuit in the semiconductor memory device 200.

The controller 155 may further recording selected second test result of the second test result in the first fail address memory 160, and the selected second test result is associated with uncorrectable errors that exceed error correction capability of the error correction circuit. The test device 150 may repair fail cells associated with the uncorrectable errors by redundancy repair operation by referring to the first fail address memory.

Figure 3:
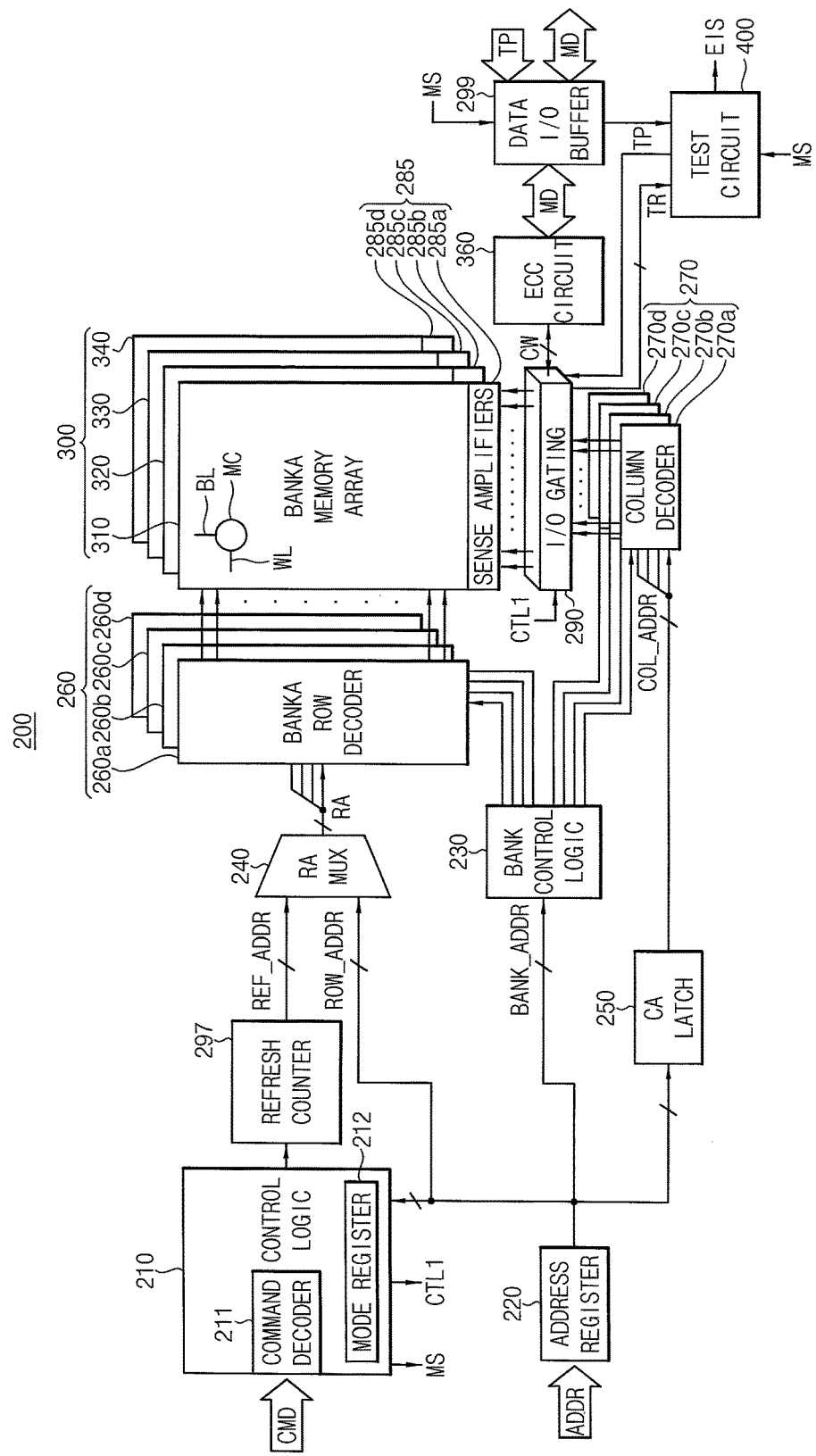
FIG. 3 is a block diagram illustrating a semiconductor memory device shown in FIGS. 1 and 2.

FIG. 3 is a block diagram illustrating the semiconductor memory device shown in FIGS. 1 and 2.

Referring to FIG. 3, the semiconductor memory device 200 may include a control logic circuit 210, an address register 220, a bank control logic 230, a refresh counter 297, a row address (RA) multiplexer 240, a column address (CA) latch 250, a row decoder 260, a column decoder 270, a memory cell array 300, a sense amplifier unit 285, an input/output (I/O) gating circuit 290, an error correction circuit 360, a data input/output (I/O) buffer 299, and a test circuit 400.

The memory cell array 300 may include first through fourth bank arrays 310-340. The row decoder 260 may include first through fourth bank row decoders 260a-260d respectively coupled to the first through fourth bank arrays 310-340, the column decoder 270 may include first through fourth bank column decoders 270a-270d respectively coupled to the first through fourth bank arrays 310-340, and the sense amplifier unit 285 may include first through fourth bank sense amplifiers 285a-280d respectively coupled to the first through fourth bank arrays 310-340. Each of the first through fourth bank arrays 310-340 may include a plurality of memory cells MC, and each of memory cells MC is coupled to a corresponding word-line WL and a corresponding bit-line BL. The first through fourth bank arrays 310-340, the first through fourth bank row decoders 260a-260d, the first through fourth bank column decoders 270a-270d and first through fourth bank sense amplifiers 285a-280d may form first through fourth banks. Although the semiconductor memory device 200 shown in FIG. 3 illustrates four banks, the semiconductor memory device 200a may include other number of banks.

The address register 220 may receive an address ADDR including a bank address BANK_ADDR, a row address ROW_ADDR and a column address COL_ADDR from the memory controller 100. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through fourth bank row decoders 260a-260d corresponding to the bank address BANK_ADDR may be activated in response to the bank control signals, and one of the first through fourth bank column decoders 270a-270d corresponding to the bank address BANK_ADDR may be activated in response to the bank control signals.

The refresh counter 297 may generate a refresh row address REF_ADDR for refreshing memory cell rows in the memory cell array 300 under control of the control logic circuit 210. When the semiconductor memory device 200 is implemented with a resistive type memory device, the refresh counter 297 is not included in the semiconductor memory device 200.

The row address multiplexer 240 may receive the row address ROW_ADDR from the address register 220, and may receive the refresh row address REF_ADDR from the refresh counter 297. The row address multiplexer 240 may selectively output the row address ROW_ADDR or the refresh row address REF_ADDR as a row address RA. The row address RA that is output from the row address multiplexer 240 may be applied to the first through fourth bank row decoders 260a-260d.

The activated one of the first through fourth bank row decoders 260a-260d may decode the row address RA that is output from the row address multiplexer 240, and may activate a word-line corresponding to the row address RA. For example, the activated bank row decoder may apply a word-line driving voltage to the word-line corresponding to the row address RA.

The column address latch 250 may receive the column address COL_ADDR from the address register 220, and may temporarily store the received column address COL_ADDR. In some example embodiments, in a burst mode, the column address latch 250 may generate column addresses that increment from the received column address COL_ADDR. The column address latch 250 may apply the temporarily stored or generated column address to the first through fourth bank column decoders 270a-270d.

The activated one of the first through fourth bank column decoders 270a-270d may decode the column address COL_ADDR that is output from the column address latch 250, and may control the I/O gating circuit 290 in order to output data corresponding to the column address COL_ADDR.

The I/O gating circuit 290 may include a circuitry for gating input/output data. The I/O gating circuit 290 may further include read data latches for storing data that is output from the first through fourth bank arrays 310-340, and write drivers for writing data to the first through fourth bank arrays 310-340.

Codeword CW read from one bank array of the first through fourth bank arrays 310-340 may be sensed by sense amplifiers coupled to the one bank array from which the data is to be read, and may be stored in the read data latches. The codeword CW stored in the read data latches may be provided to the memory controller 100 via the ECC circuit 360 and the data I/O buffer 299. Main data MD to be written in one bank array of the first through fourth bank arrays 310-340 may be provided to the data I/O buffer 299 from the memory controller 100. The main data MD provided to the data I/O buffer 299 is encoded to the codeword CW in the ECC circuit 360. The write driver may write the codeword CW in one bank array of the first through fourth bank arrays 310-340.

The data I/O buffer 299 receives the test pattern data TP from the test device 150 or the memory controller 100 in a test mode, and provides the test pattern data TP to the test circuit 400. The test circuit 400 provides the test pattern data TP to the I/O gating circuit 290. The I/O gating circuit 290 writes the test pattern data TP to a target page of the memory cell array 300 and reads the test pattern data TP from the target page to provide test result data TR to the test circuit 400 in a test mode.

The test circuit 400 may perform a first test on the memory cell array 300 to selectively record a first test result associated with the first test in the first fail address memory 160 and may perform a second test on the memory cell array 300 to record a second test result associated with the second test in the second fail address memory 170, based on the test pattern data TP in the test mode.

The test circuit 400 may write the test pattern data TP in the memory cell array 300, read a first size of the test pattern data TP as a first size of test result data and compare corresponding bits of the first size of the test result data and the test pattern data TP stored therein to generate a comparison signal. The test circuit 400 may perform the first test by comparing bits of each first unit in the comparison signal while counting a number of errors in the test result data and may perform the second test by comparing corresponding bits in the first units in the comparison signal as each second unit while comparing the bits of each first unit.

The test circuit 400 may transmit a first test result signal and a second test result signal as the error information signal EIS to the test device 150. The first test result signal corresponds to a result of the first test and the second test result signal corresponds to a result of the second test.

The error correction circuit (which is also referred to an error correction code (ECC) circuit) 360 generates parity data based on the main data MD from the data I/O buffer 299 in a write operation of a normal mode, and provides the I/O gating circuit 290 with the codeword CW including the main data MD and the parity data. The I/O gating circuit 290 writes the codeword CW to the target page of the memory cell array 300.

In addition, in a read operation of the normal mode, the ECC circuit 360 receives the codeword CW which is read from the target page from the I/O gating circuit 290. The ECC circuit 360 decodes the main data MD using the parity data in the codeword CW, corrects a single bit error in the main data MD and provides the data I/O buffer 299 with the error-corrected main data.

The control logic circuit 210 may control operations of the semiconductor memory device 200. For example, the control logic circuit 210 may generate control signals for the semiconductor memory device 200 in order to perform a write operation or a read operation. The control logic circuit 210 may include a command decoder 211 that decodes a command CMD received from the memory controller 100 and a mode register 212 that sets an operation mode of the semiconductor memory device 200.

For example, the command decoder 211 may generate the control signals corresponding to the command CMD by decoding a write enable signal (/WE), a row address strobe signal (/RAS), a column address strobe signal (/CAS), a chip select signal (/CS), etc. The command decoder 211 may generate a mode signal MS directing an operation mode of the semiconductor memory device 200 by decoding the command CMD and may generate a control signal CTL1. The control logic circuit 210 may provide the mode signal MS to the data I/O buffer 299 and the test circuit 400 and may provide the control signal CTL1 to the I/O gating circuit 290.

The mode signal MS indicates one of the test mode and the normal mode of the semiconductor memory device 200.

In addition, in an example embodiment, a three dimensional (3D) memory array is provided in semiconductor memory device 200. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference, describe suitable configurations for the 3D memory arrays, in which the three-dimensional memory array is configured as a plurality of levels, with word-lines and/or bit-lines shared between levels: U.S. Pat. Nos. 7,679,133; 8,553,466; 8,654,587; 8,559,235; and US Pat. Pub. No. 2011/0233648.

Figure 4:
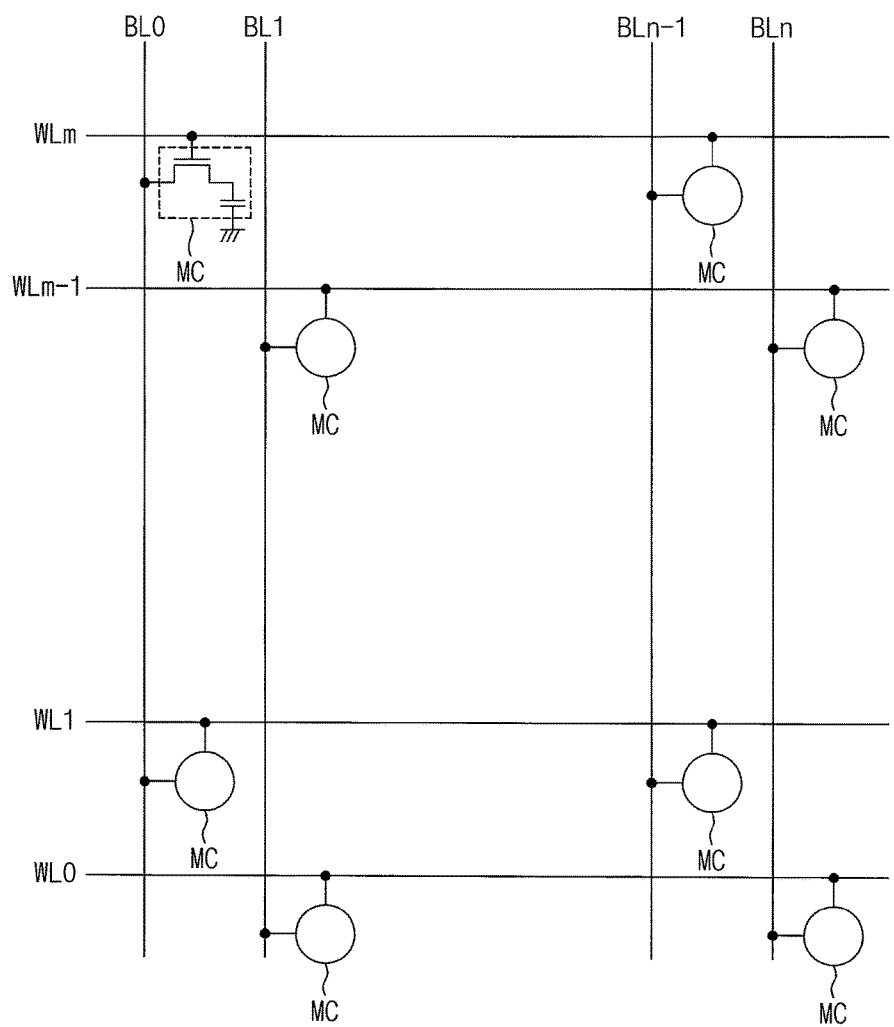
FIG. 4 is a block diagram illustrating an example of one bank array in the semiconductor memory device of FIG. 3 according to at least one example embodiment.

FIG. 4 is a block diagram illustrating an example of one bank array in the semiconductor memory device of FIG. 3 according to at least one example embodiment.

Referring to FIG. 4, each of the bank arrays 310-340 may include a plurality of memory cells are arranged in columns and rows. Each of the bank arrays 310-340 may include a plurality of word-lines WL0-WLm (m is natural number greater than 2), a plurality of bit-lines BL0-BLn (n is a natural number greater than 2), and a plurality of memory cells MCs disposed near intersections between the word-lines WL0-WLm and the bit-lines BL0-BLn. In one example embodiment, each of the plurality of memory cells MCs may include a dynamic random access memory (DRAM) cell structure.

Although not illustrated, each of the bank arrays 310-340 may include a plurality of resistive type memory cells disposed near intersections between the word-lines WL0-WLm and the bit-lines BL0-BLn. Each of the resistive type memory cells may be spin transfer torque magnetoresistive random access memory (STT-MRAM).

An MRAM is a nonvolatile computer memory based on magnetoresistance. An MRAM is different from a volatile RAM in many aspects. For example, since an MRAM is nonvolatile, the MRAM may retain all stored data even when power is turned off.

Although a nonvolatile RAM is generally slower than a volatile RAM, an MRAM has read and write response times comparable with read and write response times of a volatile RAM. Unlike a conventional RAM that stores data as electric charge, an MRAM stores data by using magnetoresistance (or magnetoresistive) elements. In general, a magnetoresistance element is made of two magnetic layers, each having a magnetization.

An MRAM is a nonvolatile memory device that reads and writes data by using a magnetic tunnel junction pattern including two magnetic layers and an insulating film disposed between the two magnetic layers. A resistance value of the magnetic tunnel junction pattern may vary according to a magnetization direction of each of the magnetic layers. The MRAM may program or remove data by using the variation of the resistance value.

An MRAM using a spin transfer torque (STT) phenomenon uses a method in which when a spin-polarized current flows in one direction, a magnetization direction of the magnetic layer is changed due to the spin transfer of electrons. A magnetization direction of one magnetic layer (e.g., a pinned layer) may be fixed and a magnetization direction of the other magnetic layer (e.g., a free layer) may vary according to a magnetic field generated by a program current.

The magnetic field of the program current may arrange the magnetization directions of the two magnetic layers in parallel or in anti-parallel. In at least one example embodiment, if the magnetization directions of the two magnetic layers are parallel, a resistance between the two magnetic layers is in a low ("0") state. If the magnetization directions of the two magnetic layers are anti-parallel, a resistance between the two magnetic layers is in a high ("1") state. Switching of the magnetization direction of the free layer and the high or low state of the resistance between the two magnetic layers result in write and read operations of the MRAM.

Although the MRAM is nonvolatile and provides a quick response time, an MRAM cell has a limited scale and is sensitive to write disturbance because the program current applied to switch the high and low states of the resistance between the magnetic layers of the MRAM is typically high. Accordingly, when a plurality of cells are arranged in an MRAM array, a program current applied to one memory cell changes a magnetic field of a free layer of an adjacent cell. Such a write disturbance may be mitigated (or alternatively, prevented) by using an STT phenomenon. A typical STT-MRAM may include a magnetic tunnel junction (MTJ), which is a magnetoresistive data storage device including two magnetic layers (e.g., a pinned layer and a free layer) and an insulating layer disposed between the two magnetic layers.

A program current typically flows through the MTJ. The pinned layer spin-polarizes electrons of the program current, and a torque is generated as the spin-polarized electron current passes through the MTJ. The spin-polarized electron current applies the torque to the free layer while interacting with the free layer. When the torque of the spin-polarized electron current passing through the MTJ is greater than a threshold switching current density, the torque applied by the spin-polarized electron current is sufficient to switch a magnetization direction of the free layer. Accordingly, the magnetization direction of the free layer may be parallel or anti-parallel to the pinned layer and a resistance state in the MTJ is changed.

The STT-MRAM removes a requirement of an external magnetic field for the spin-polarized electron current to switch the free layer in the magnetoresistive device. In addition, the STT-MRAM improves scaling as a cell size is reduced and the program current is reduced to mitigate (or alternatively, prevent) the write disturbance. In addition, the STT-MRAM may have a high tunnel magnetoresistance ratio, which improves a read operation in a magnetic domain by allowing a high ratio between the high and low states.

An MRAM is an all-round memory device that is low cost and has high capacity (like a dynamic random access memory (DRAM), operates at high speed (like a static random access memory (SRAM), and is nonvolatile (like a flash memory).

Figure 5:
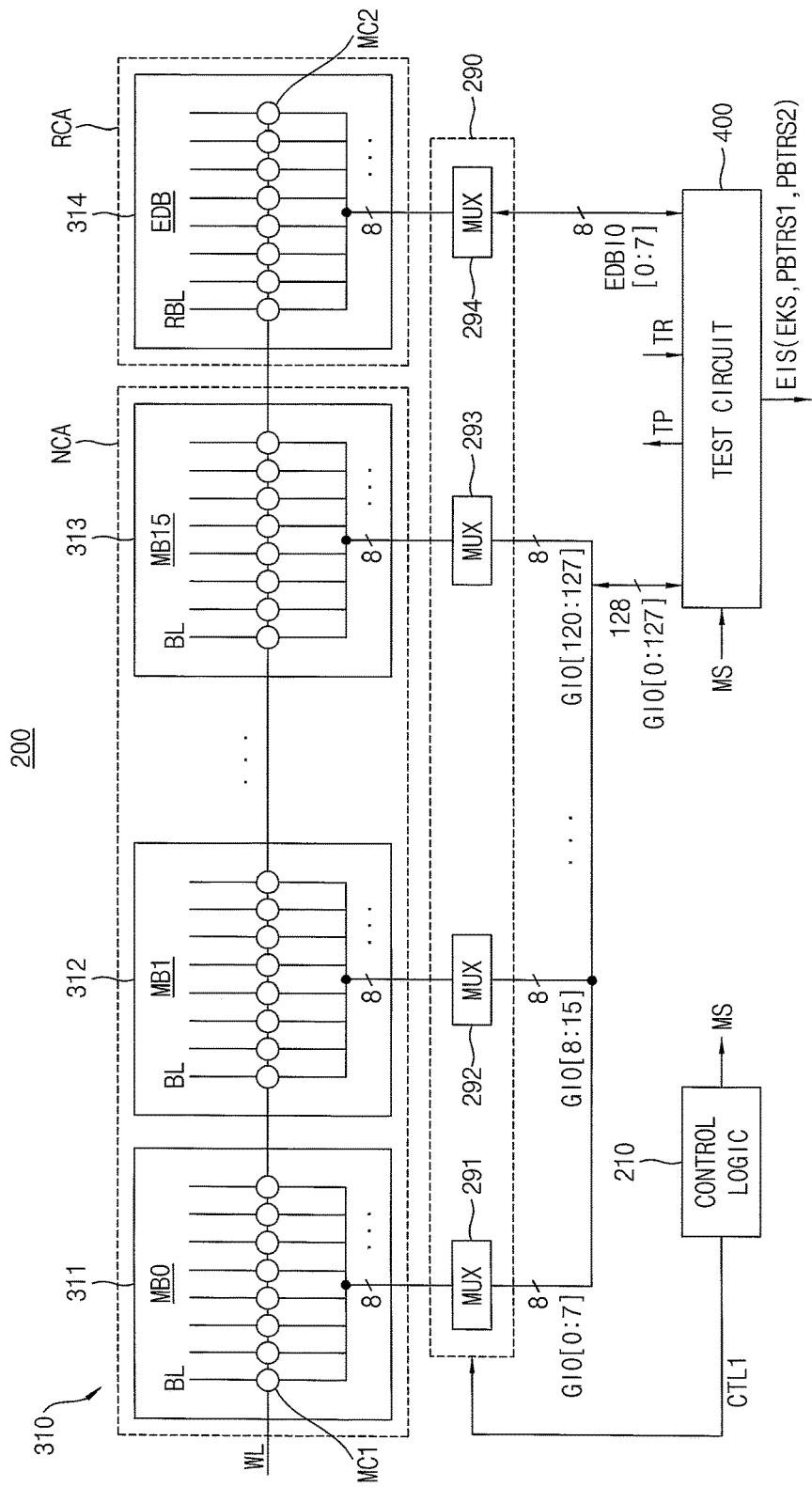
FIG. 5 illustrates a portion of the semiconductor memory device of FIG. 3 in a test mode according to at least one example embodiment.

FIG. 5 illustrates a portion of the semiconductor memory device of FIG. 3 in a test mode.

In FIG. 5, the first bank array 310, the I/O gating circuit 290, the test circuit 400, and the control logic circuit 210 are illustrated.

Referring to FIG. 5, the first bank array 310 may include a normal cell array NCA and a redundancy cell array RCA. The normal cell array NCA may include a plurality of first memory blocks MB0-MB15, i.e., 311-313, and the redundancy cell array RCA may include at least a second memory block 314. The first memory blocks 311-313 are memory blocks determining a memory capacity of the semiconductor memory device 200. The second memory block 314 is for ECC and/or redundancy repair. Since the second memory block 314 for ECC and/or redundancy repair is used for ECC, data line repair and block repair to repair 'fail' cells generated in the first memory blocks 311-313, the second memory block is also referred to as an EDB block.

In each of the first memory blocks 311-313, a plurality of first memory cells MC1 are arrayed in rows and columns. In the second memory block 314, a plurality of second memory cells MC2 are arrayed in rows and columns.

In the first memory blocks 311-313, rows may be formed, for example, of 8K word-lines WL and columns may be formed, for example, of 1K bit-lines BL. Memory cells connected to intersections of the word-lines WL and the bit-lines BL may be dynamic memory cells or resistive type memory cells.

The I/O gating circuit 290 includes a plurality of switching circuit 291-294 circuits respectively connected to the first memory blocks 311-313 and the second memory block 314. In the semiconductor memory device 200, bit lines corresponding to data of a burst length may be simultaneously accessed to support the burst length indicating the maximum number of column locations that is accessible. For example, if the burst length is set to 8, data bits may be set to 128 bits.

The test circuit 400 is connected to the switching circuits 291-294 through corresponding first data lines GIO[0:127] and second data lines EDBIO[0:7]. The test circuit 400, in a test mode, writes the test pattern data TP in the first memory blocks 311-313 and the second memory block 314 reads test result data TR corresponding to the test pattern data TP, compares corresponding bits of test pattern data TP and the test result data TR to generate a comparison signal and generates an error kind signal EKS indicating whether the test result data TR includes errors that exceed error correction capability of the error correction circuit 360.

The test circuit 400 compares each first unit in bits of the comparison signal to generate a first result signal and records the error kind signal EKS and the first result signal as a first test result signal PBTRS1 in the first fail address memory 160. The test circuit 400 compares corresponding bits in the first units as each second unit to output a second result signal and records the first result signal and the second result signal as a second test result signal PBTRS2 in the second fail address memory 170.

Figure 6:
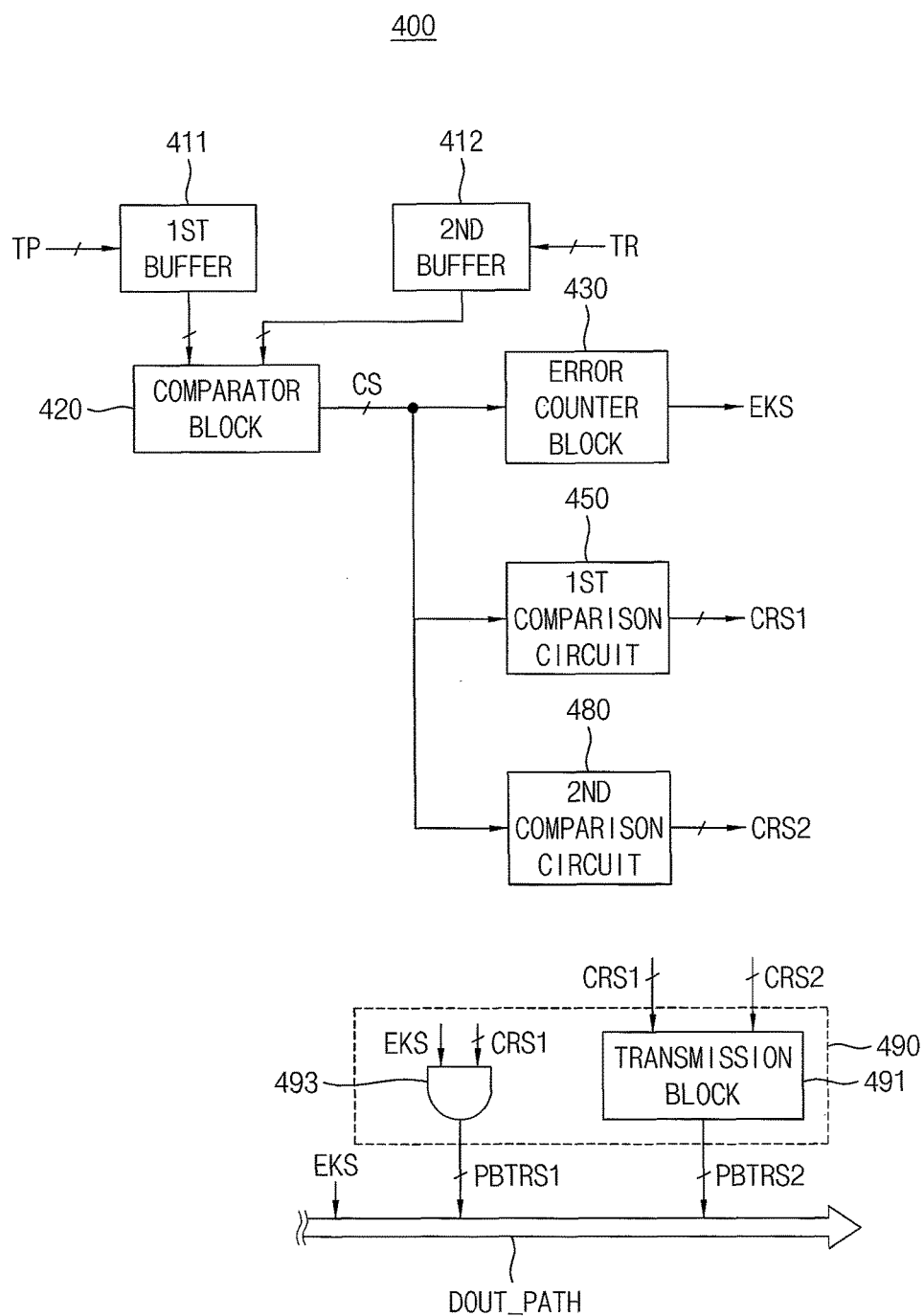
FIG. 6 is a block diagram illustrating a test circuit shown in the semiconductor memory device of FIG. 3 according to at least one example embodiment.

FIG. 6 is a block diagram illustrating the test circuit shown in the semiconductor memory device of FIG. 3.

Referring to FIG. 6, the test circuit 400 a first buffer 411, a second buffer 412, a comparator block 420, an error counter block 430, a first comparison circuit 450, a second comparison circuit 480, and a transmission circuit 490.

The first buffer 411 stores the test pattern data TP from the data I/O buffer 299 in the test mode. The I/O gating circuit 290 writes the test pattern data TP to the target page of the memory cell array 300. The second buffer 412 stores the test result data TR read from the target page of the memory cell array 300. The comparator block 420 is coupled to the first buffer 411 and the second buffer 412, compares corresponding bits of the test pattern data TP and the test result data TR and outputs comparison signal CS indicating the comparison result. The comparator block 420 may provide the comparison signal CS to the error counter block 430, the first comparison circuit 450 and the second comparison circuit 480.

The error counter block 430 may provide the transmission circuit 490 with the error kind signal EKS having a logic level according to a number of errors associated with the test result data TR based on the comparison signal CS having a first size of bits. The error kind signal EKS has a first logic level (low level) when the number of errors associated with the test result data TR is within error correction capability of the error correction circuit 360. The error kind signal EKS has a second logic level (high level) when the number of errors associated with the test result data TR is beyond error correction capability of the error correction circuit 360 (uncorrectable errors).

The first comparison circuit 450 may compare the bits of each first unit in the first size of comparison signal CS to output a first result signal CRS1 and a second comparison circuit 480 may compare corresponding bits in the first units as each second unit to output the second result signal CRS2. The first size may correspond to codeword size of the semiconductor memory device 200 and the first unit may correspond to a burst length of the semiconductor memory device 200.

The transmission circuit 490 includes a transmission block 491 and an AND gate 493. The AND gate 493 performs an AND operation on the error kind signal EKS and the first result signal CRS1 to output the first test result signal PBTRS1. Therefore, the first test result signal PBTRS1 may have the same logic level as the first result signal CRS1 when the error kind signal EKS indicates the uncorrectable errors. Therefore, the first test result signal PBTRS1 may be recorded in the first fail address memory 160 only when the first result signal CRS1 indicates the uncorrectable errors.

The transmission block 491 may output the first result signal CRS1 and the second result signal CRS2 as the second test result signal PBTRS2. The transmission circuit 490 may transmit the error kind signal EKS, the first test result signal PBTRS1 and the second test result signal PBTRS2 to the test device 150 or the memory controller 100 as the error information signal EIS through a data output path DOUT_PATH of the semiconductor memory device 200.

Figure 7:
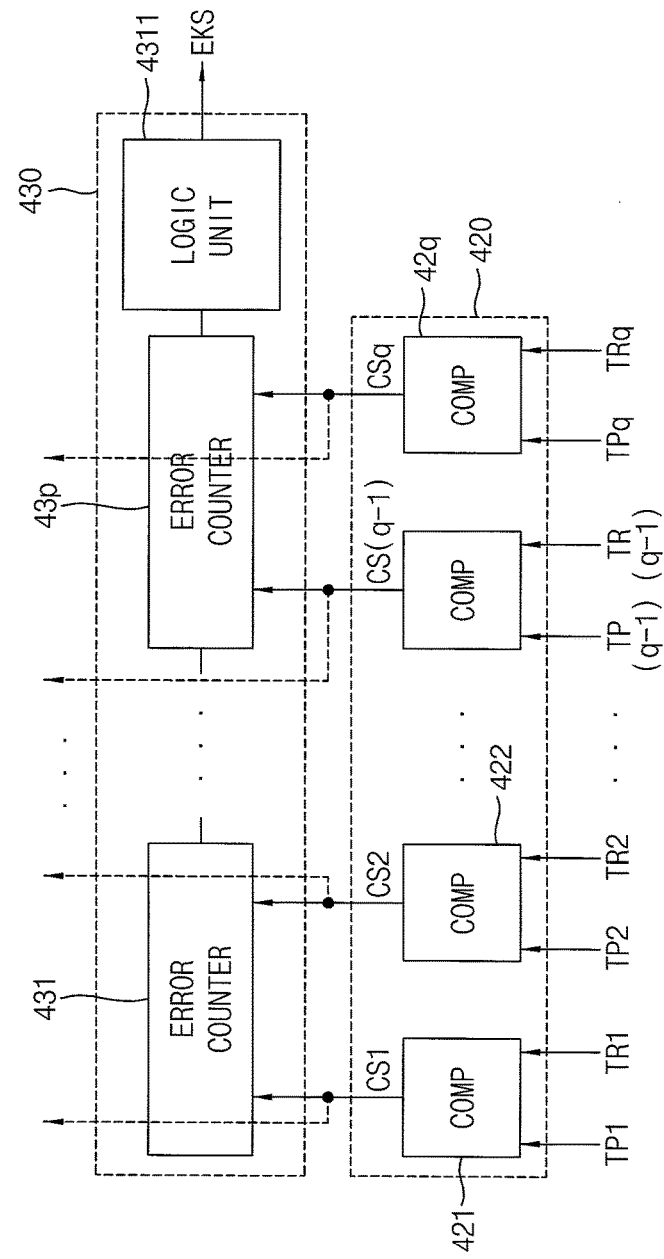
FIG. 7 illustrates a comparator block and an error counter block in the test circuit of FIG. 6 according to at least one example embodiment.

FIG. 7 illustrates the comparator block and the error counter block in the test circuit of FIG. 6.

Referring to FIGS. 6 and 7, the comparator block 420 may include a plurality of comparators 421-42$q$ (q is a natural number greater than 3), and each of the comparators 421-42$q$ compares each of corresponding bits TP1 and TR1-TPq and TRq of the test pattern data TP and the test result data TR to output corresponding bit of the comparison signal CS1-CSq.

The error counter block 430 includes a plurality of error counters 431-43$p$ (p is a natural number greater than 1) and a logic unit 4311. Each of the error counters 431-43$p$ receives two bits of the comparison signal CS and counts a number of errors in the two bits. The logic unit 4311 outputs the error kind signal EKS based on the outputs of the error counters 431-43$p$. The logic unit 4311 may be connected to the error counter 43$p$. The logic unit 4311 may include an OR gate.

Figure 8:
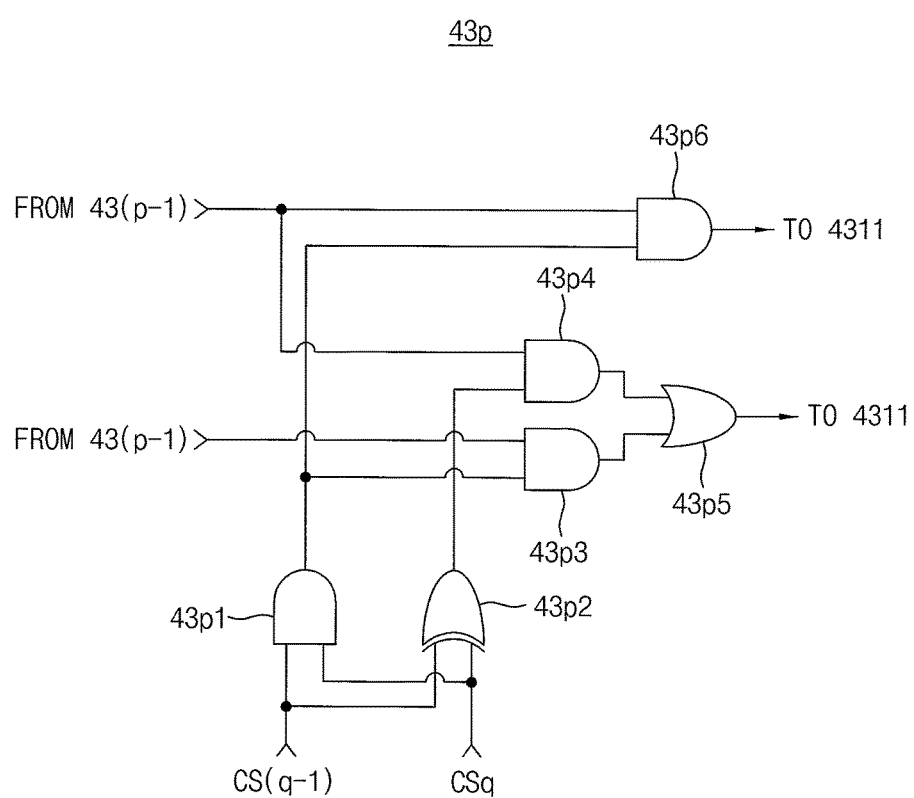
FIG. 8 illustrates one of error counters in FIG. 7 according to at least one example embodiment.

FIG. 8 illustrates one of the error counters in FIG. 7 according to at least one example embodiment.

Referring to FIG. 8, the error counter 43*p* includes an AND gate 43*p*1, an XOR gate 43*p*2, AND gates 43*p*3 and 43*p*4, an OR gate 43*p*5 and an AND gate 43*p*6.

The AND gate 43*p*1 performs AND operation on two most significant bits CS(q−1) and CSq and the XOR gate 43*p*2 performs XOR operation on the two most significant bits CS(q−1) and CSq. The AND gate 43*p*3 performs AND operation an output of the adjacent error counter 43(*p*−1) and an output of the AND gate 43*p*1 and the AND gate 43*p*4 performs AND operation on the output of the adjacent error counter 43(*p*−1) and an output of the XOR gate 43*p*2. The OR gate 43*p*5 performs OR operation on outputs of the AND gates 43*p*3 and 43*p*4 to output a result of the OR operation and the AND gate 43*p*6 performs the output of the adjacent error counter 43(*p*−1) and the output of the AND gate 43*p*1 to output a result of the AND operation.

The logic unit 4311 outputs the error kind signal EKS with a low level when the comparison signal CS indicates no error or correctable error. The logic unit 4311 outputs the error kind signal EKS with a high level when the comparison signal CS indicates uncorrectable errors.

Figure 9:
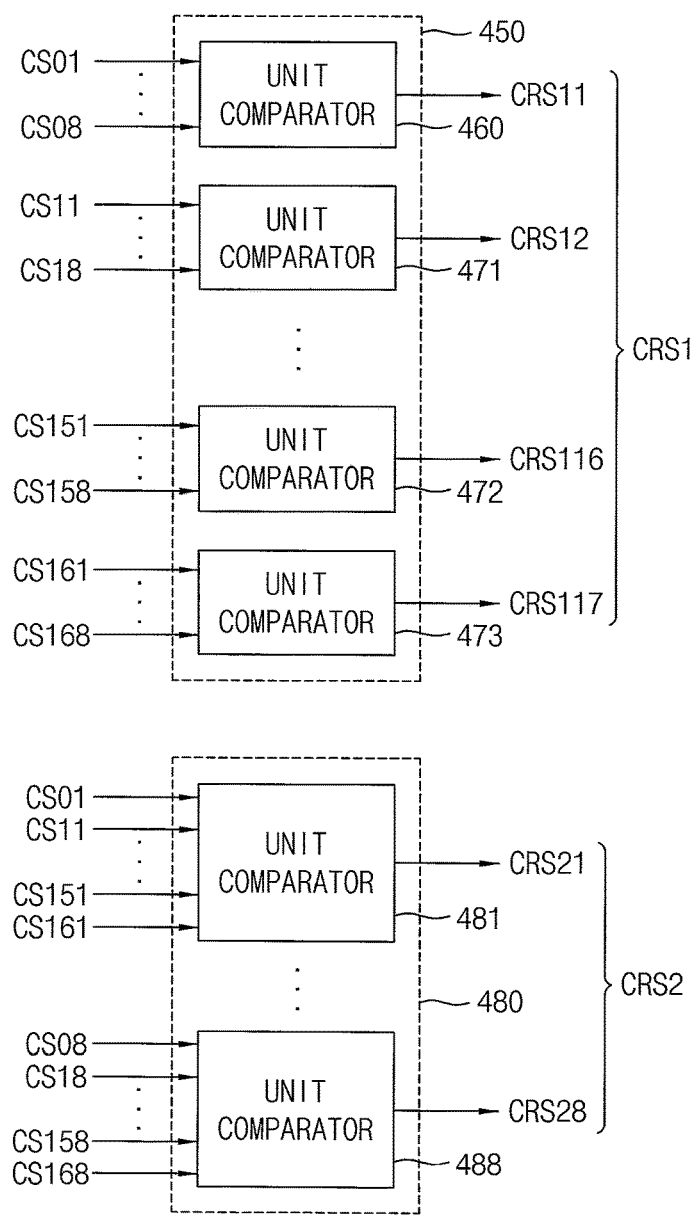
FIG. 9 is a block diagram illustrating a first comparison circuit and a second comparison circuit in the test circuit of FIG. 6 according to at least one example embodiment.

FIG. 9 is a block diagram illustrating the first comparison circuit and the second comparison circuit in the test circuit of FIG. 6.

Referring to FIG. 9, the first comparison circuit 450 compares the bits in each first unit of the comparison signal CS to output the first result signal CRS1 and the second comparison circuit 480 compares the corresponding bits in each first unit as the second unit to output the second result signal CRS2.

The first comparison circuit 450 may include a plurality of first unit comparators 460 and 471-473 and the second comparison circuit 480 may include a plurality of second unit comparators 481-488.

The unit comparator 460 receives the first unit of bits of the comparison signal CS01-0508, and compares whether the first unit of bits of the comparison signal CS01-0508 are same with respect to each other to output a first bit CRS11 of the first result signal CRS1, which indicates the comparison result. The unit comparator 471 receives the first unit of bits of the comparison signal CS11-CS18 and compares whether the first unit of bits of the comparison signal CS11-CS18 are same with respect to each other to output a second bit CRS12 of the first result signal CRS1, which indicates the comparison result. The unit comparator 472 receives the first unit of bits of the comparison signal CS151-CS158 and compares whether the first unit of bits of the comparison signal CS151-CS158 are same with respect to each other to output a sixteenth bit CRS116 of the first result signal CRS1, which indicates the comparison result. The unit comparator 473 receives the first unit of bits of the comparison signal CS161-CS168 and compares whether the first unit of bits of the comparison signal CS161-CS168 are same with respect to each other to output a seventeenth bit CRS117 of the first result signal CRS1, which indicates the comparison result.

The unit comparator 481 compares whether first bits CR01, CR11, . . . , CR151, TR161 in the first units of the comparison signal as the second unit are same with respect to each other and outputs a first bit CRS21 of the second result signal CRS2, which indicates the comparison result. The unit comparator 488 compares whether eighth bits CR08, CR18, . . . , CR158, TR168 in the first units of comparison signal as the second unit are same with respect to each other and outputs an eighth bit CRS28 of the second result signal CRS2, which indicates the comparison result.

Figure 10:
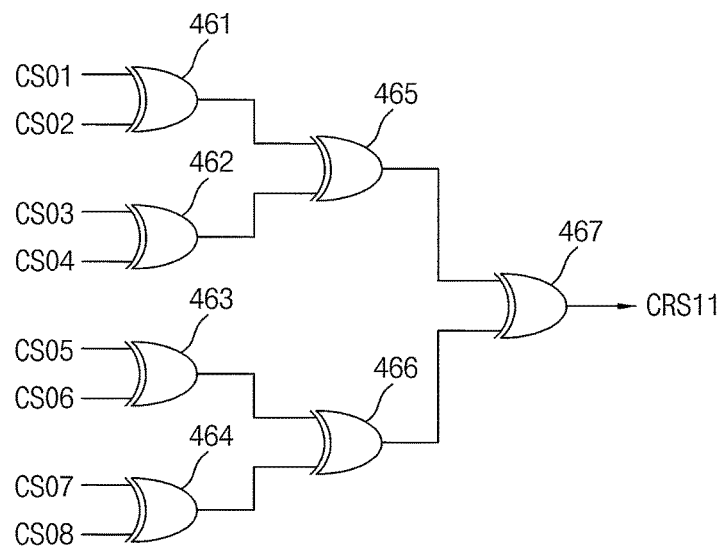
FIG. 10 illustrates one of first unit comparators shown in FIG. 9 according to an example embodiment.

FIG. 10 illustrates one of the first unit comparators shown in FIG. 9.

Although FIG. 10 illustrates the first unit comparator 460, each of the unit comparators 471, 472 and 473 has a substantially same configuration as the first unit comparator 460.

Referring to FIG. 10, the first unit comparator 460 includes a plurality of XOR gates 461-467.

Each of the XOR gates 461-464 compare two bits of the first unit of the bits of the comparison signal CS01-CS08. The XOR gate 465 compares outputs of the XOR gates 461 and 462, the XOR gate 466 compares outputs of the XOR gates 463 and 464, and XOR gate 467 compares outputs of the XOR gates 465 and 466 to output the first bit CRS11 of the first result signal CRS1, which indicates whether the bits of the comparison signal CS01-0508 are same with respect to each other.

Each of the unit comparators 481 and 488 of the second comparison circuit 480 may have a similar configuration with the first unit comparator 460.

Figure 11:
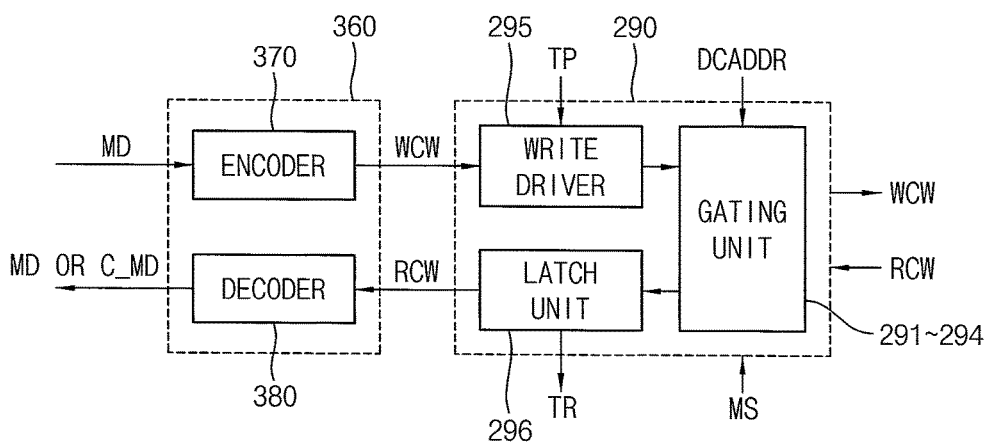
FIG. 11 illustrates an error correction circuit and an input/output (I/O) gating circuit in the semiconductor memory device of FIG. 3 according to at least one example embodiment.

FIG. 11 illustrates the error correction circuit and the I/O gating circuit in the semiconductor memory device of FIG. 3 according to at least one example embodiment.

Referring to FIG. 11, the error correction circuit 360 includes an encoder 370 and a decoder 380. The I/O gating circuit 290 includes a gating unit 291-294, a write driver 295 and a latch unit 296.

The encoder 370 receives the main data MD including a plurality of unit data, encodes the main data MD to generate the parity data and provides the write driver 295 with the codeword (or a write codeword) WCW having the main data MD and the parity data in a write operation of a normal mode. The decoder 380 receives the codeword (or a read codeword) RCW from the I/O gating circuit 290, corrects errors in the main data MD using the parity data in the codeword RCW and provides the corrected main data MD or C_MD to the memory controller 100 though the data I/O buffer 299 in a read operation of a normal mode.

The gating unit 291-294 gates the write codeword WCW from the write driver 295 to the memory cell array 300 in response to a decoded column address DCADDR and gates the read codeword RCW from the memory cell array 300 to the latch unit 296 in a normal mode. The gating unit 291-294 gates the test pattern data TP from the write driver 295 to the memory cell array 300 and gates the test result data TR from the memory cell array 300 to the lath unit 296 in the test mode. The latch unit 296 provides the decoder 380 with the read codeword RCW in the normal mode and provides the test circuit 400 with the test result data TR in the test mode in response to the mode signal MS.

Figure 12:
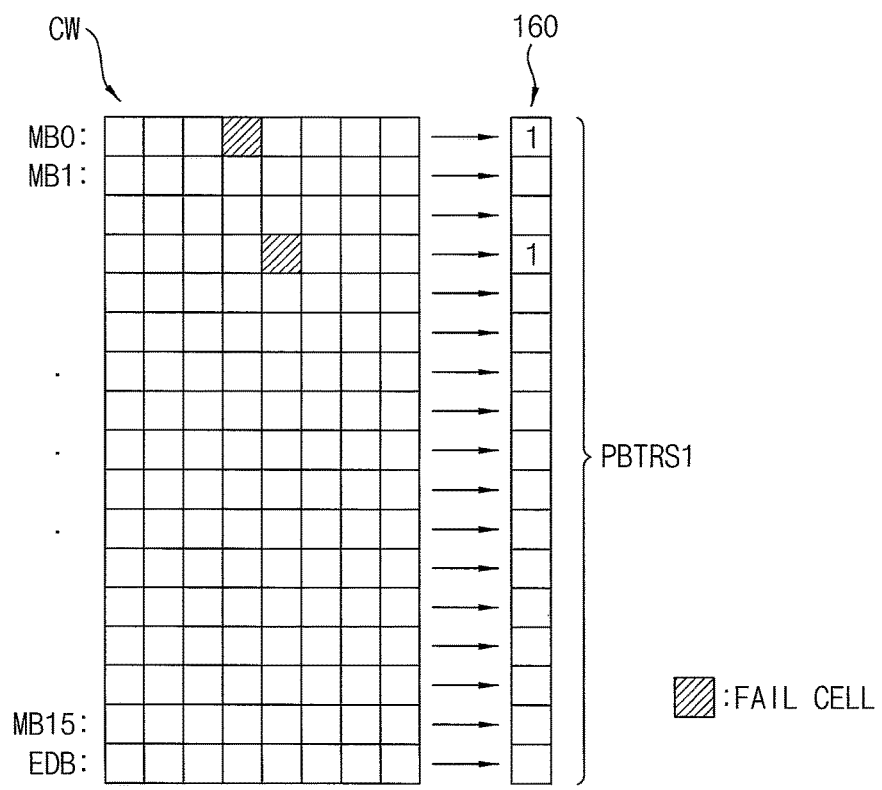
FIG. 12 illustrates an example of a first fail address memory in the memory system of FIG. 2 according to at least one example embodiment.

FIG. 12 illustrates an example of the first fail address memory in the memory system of FIG. 2.

In FIG. 12, the test pattern data on codeword CW basis is also illustrated, which is written in the first bank array 310.

Referring to FIG. 12, the first fail address memory 160 store bits of the first test result signal PBTRS1 which is the same as the first result signal CRS1 when the error kind signal EKS indicates the uncorrectable errors, i.e., when the error kind signal EKS is high level.

In FIG. 12, the memory block MB0 has a 'fail' cell and the memory block MB3 has a 'fail' cell, and thus, a first bit and a fourth bit of the first result signal CRS1 have a logic high level. For example, when one 'fail' cell exists in FIG. 12, one bit of the first result signal CRS1 has a high level and the error kind signal EKS has a low level. Therefore, each bit of the first test result signal PBTRS1 has a low level and the first test result signal PBTRS1 is not recorded in the first fail address memory 160.

Figure 13:
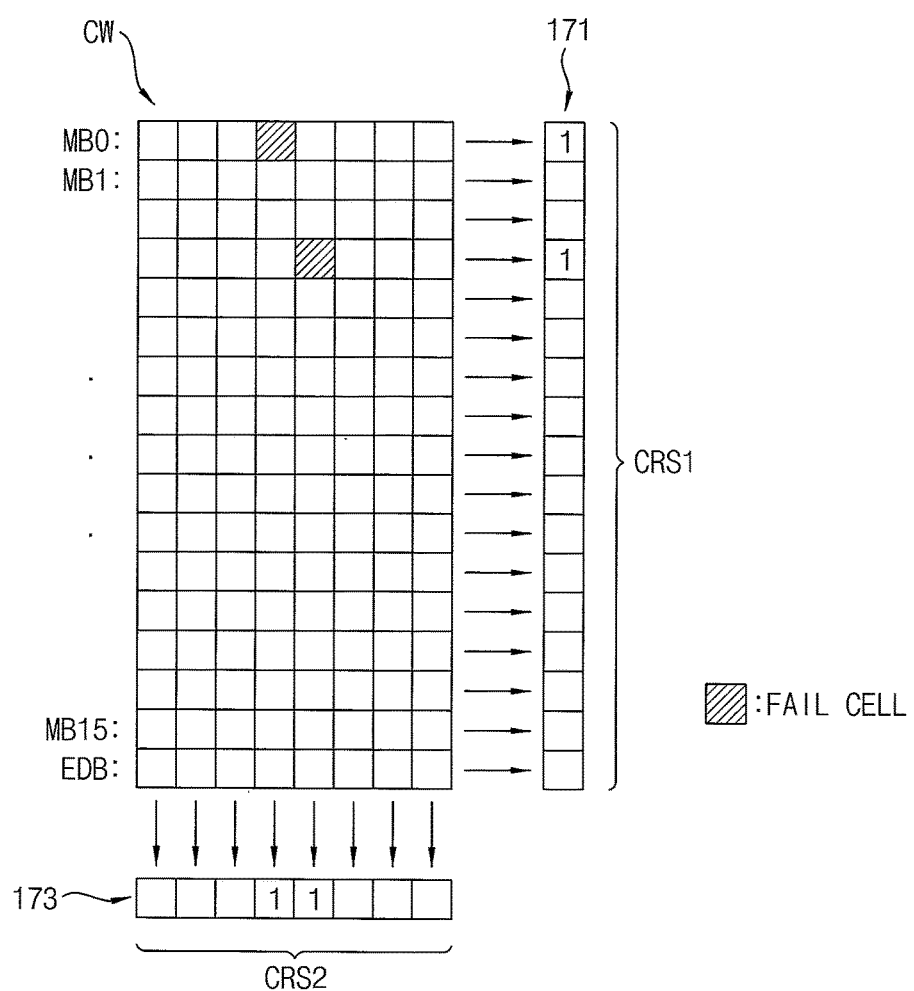
FIG. 13 illustrates an example of a second fail address memory in the memory system of FIG. 2 according to at least one example embodiment.

FIG. 13 illustrates an example of the second fail address memory in the memory system of FIG. 2.

Referring to FIG. 13, the second fail address memory 170 may include a first region 171 and a second region 173 that store bits of the first result signal CRS1 and bits of the second result signal CRS2, respectively.

In FIG. 13, the memory block MB0 has a 'fail' cell and the memory block MB3 has a 'fail' cell, and thus, a first bit and a fourth bit of the first result signal CRS1 have a logic high level and a fourth bit and a fifth bit of the second result signal CRS2 have a logic high level. That is, a memory block having a 'fail' cell is determined based on a logic level of each bit of the first result signal CRS1 and a location of the 'fail' cell is determined based on a logic level of each bit of the second result signal CRS2.

Figure 14:
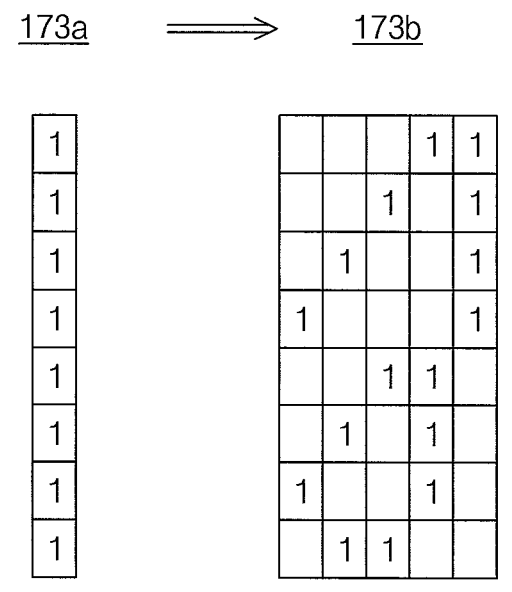

FIG. 14 illustrates that each bit in the second region in which the second result signal is stored is coded.

Referring to FIG. 14, each bit in the second region 173a may be discriminated by selecting two bits of five bits. Therefore, each of eight bits in the second region 173a in which the second result signal CRS2 is stored may be coded into five bits as in a second region 173b.

When the test pattern data TP and the test result data TR include 136 bits respectively in FIG. 6, the comparison signal CS includes 136 bits, the first result signal CRS1 includes 17 bits and the second result signal CRS2 includes 8 bits or 5 bits.

Although not illustrated, each bit in the first region 171, in which the first result signal CRS1 is stored, in the second fail address memory 170 may be coded or compressed. As described with reference to FIG. 14, the first result signal CRS1 having 17 bits may be coded (or compressed) into 9 bits.

Figure 15:
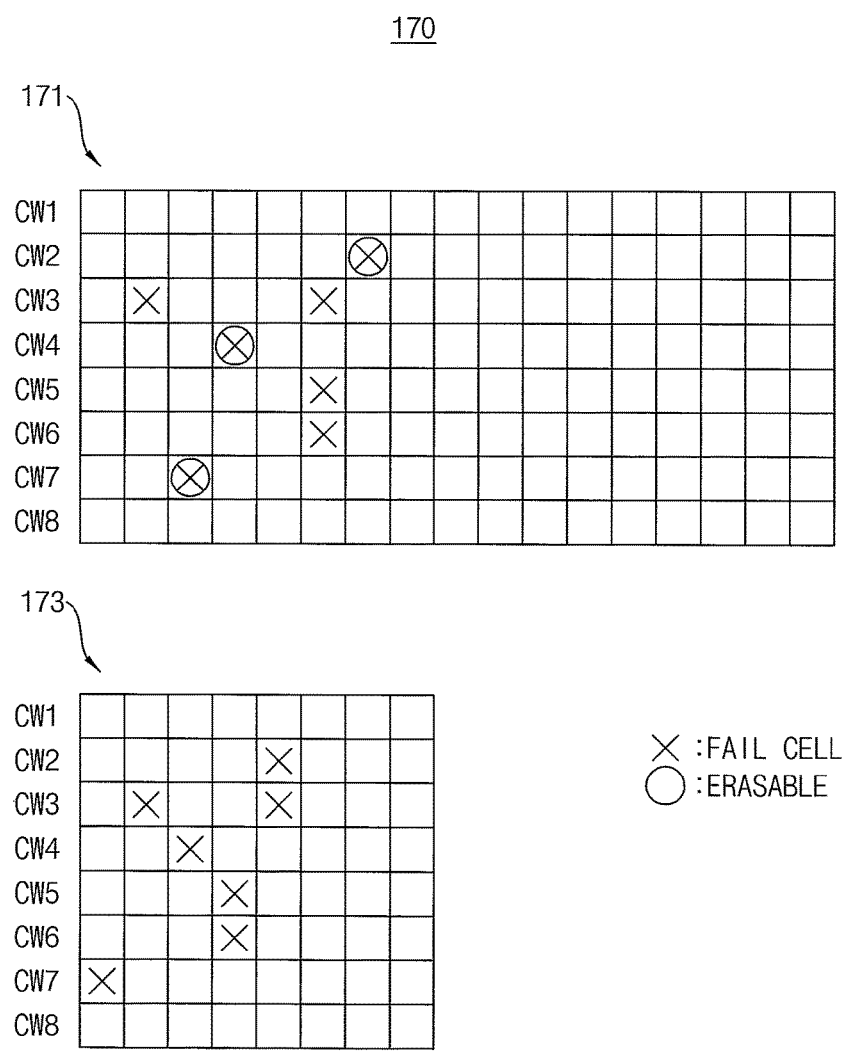

FIG. 15 illustrates the second fail address memory in the memory system in FIG. 2.

Referring to FIGS. 2 through 15, the test circuit 400 writes the test pattern data TP in the first memory blocks 311-313 and the second memory block 314 on codeword basis for one test item. The test circuit 400 reads the test result data TR from the first memory blocks 311-313 and the second memory block 314. The comparator block 420 compares corresponding bits of the test pattern data TP and the test result data TR to generate the comparison signal CS. The error counter block 430 counts a number of errors in bits of the comparison signal CS to generate the error kind signal EKS indicating whether the test result data TR includes uncorrectable errors that exceed error correction capability of the error correction circuit 360.

The first comparison circuit 450 compares the bits of each first unit in the comparison signal CS to output the first result signal CRS1. The second comparison circuit 480 compares corresponding bits in the first units as each second unit to output the second result signal CRS2. When the error kind signal EKS indicates the uncorrectable errors, the test circuit 400 records the first result signal CRS1 in the first fail address memory 160. The test circuit 400 records the first result signal CRS1 (also referred to as a first sub result) in the first region 171 of the second fail address memory 170 on a codeword basis. The test circuit 400 records the second result signal CRS2 (also referred to as a second sub result) in the second region 173 of the second fail address memory 170 on the codeword basis.

The test device 150 determines whether test is completed for all test items. When the test is not completed for all test items, the above-mentioned process is repeated. When the test is completed for all test items, the controller 155 in the test device 150 marks single-bit errors, which are correctable by the error correction circuit, in the first region 171 in the second fail address memory 170. The controller 155 further records selected second test result (that is addresses of uncorrectable fail cells), which is associated with uncorrectable errors, of the second test result recorded in the second fail address memory 170 in the first fail address memory 160. The test device 150 controls the semiconductor memory device 200 such that the fail cells associated with the uncorrectable errors are repaired by a redundancy repair operation by referring to records in the first fail address memory 160.

The test according to example embodiments may be referred to as a refining parallel bit test (rPBT) that employs merits of the first test and the second test.

Figure 16:
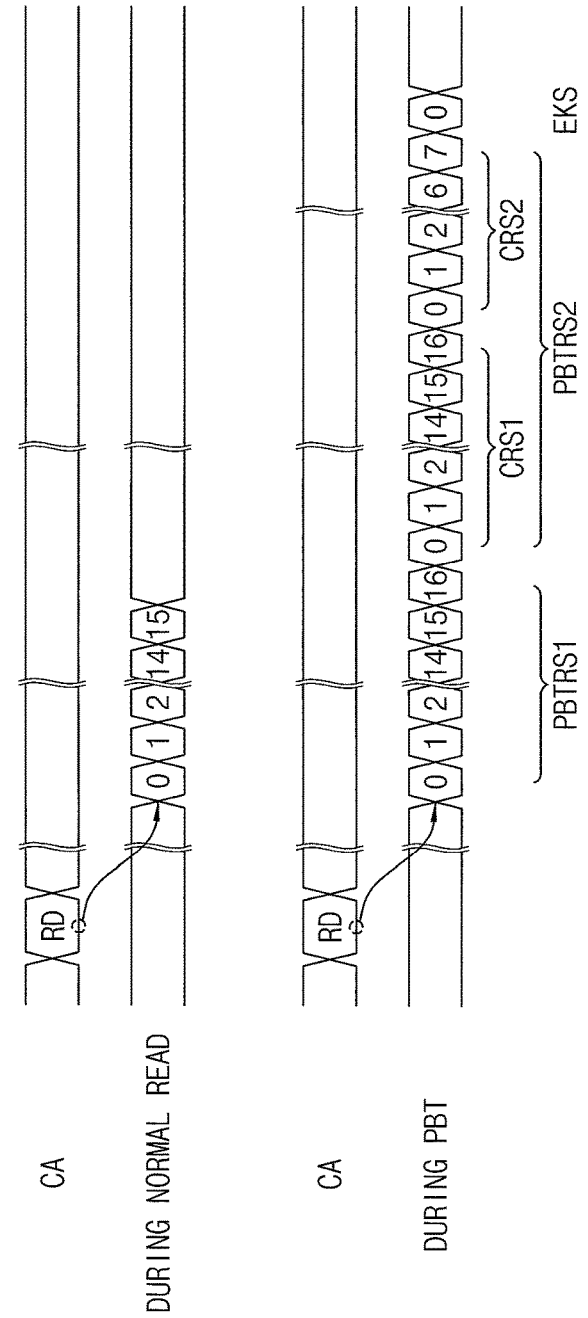
FIG. 16 is a timing diagram illustrating operation of the test circuit of FIG. 6 when the second result signal includes 8 bits according to at least one example embodiment.

FIG. 16 is a timing diagram illustrating operation of the test circuit of FIG. 6 when the second result signal includes 8 bits.

In FIG. 16, read operation of a normal mode is altogether illustrated for comparing a read operation in a test mode.

Referring to FIGS. 6 and 16, when the second result signal CRS2 includes 8 bits, the error information signal EIS is transmitted to the test device 150 through the data output path DOUT_PATH in response to a read command RD. The error information signal EIS includes the first test result signal PBTRS1, the second test result signal PBTRS2 including the first result signal CRS1 and the second result signal CRS2 and the error kind signal EKS indicating whether the uncorrectable errors are included.

Figure 17:
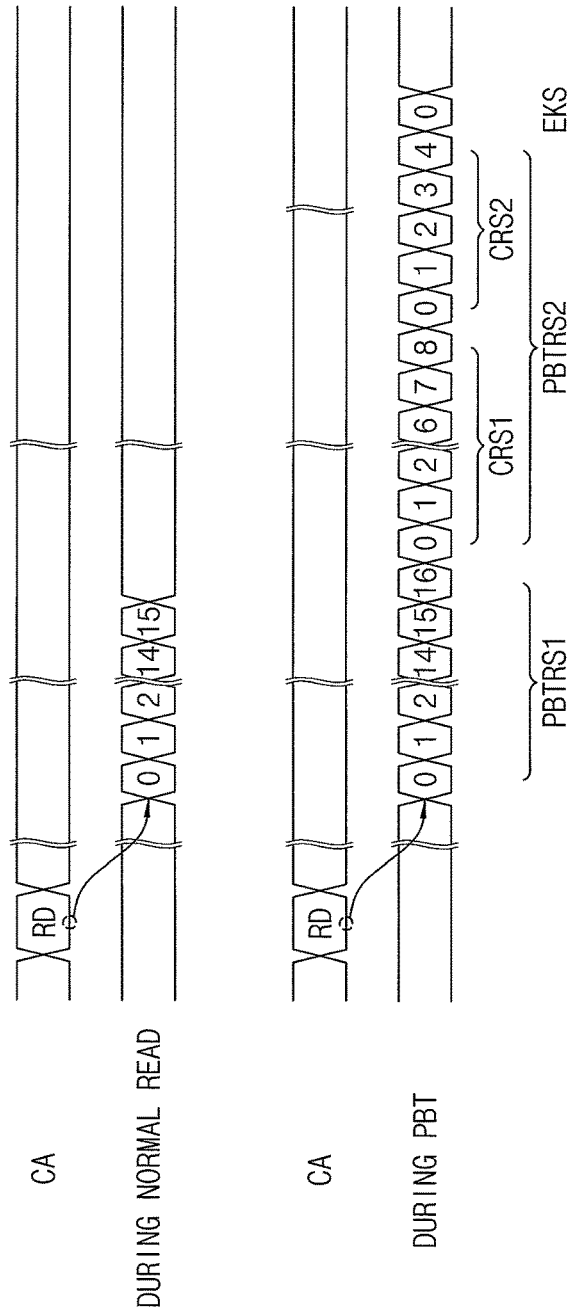
FIG. 17 is a timing diagram illustrating operation of the test circuit of FIG. 6 when the first result signal is coded into 9 bits and the second result signal is coded into 5 bits according to at least one example embodiment.

FIG. 17 is a timing diagram illustrating operation of the test circuit of FIG. 6 when the first result signal is coded into 9 bits and the second result signal is coded into 5 bits.

In FIG. 17, read operation of a normal mode is altogether illustrated for comparing a read operation in a test mode.

Referring to FIGS. 6 and 17, when the first result signal CRS1 is coded into 9 bits and the second result signal CRS2 is coded into 5 bits, the error information signal EIS is transmitted to the test device 150 through the data output path DOUT_PATH in response to a read command RD. The error information signal EIS includes the first test result signal PBTRS1, the second test result signal PBTRS2 including the first coded result signal CRS1 and the second coded result signal CRS2 and the error kind signal EKS indicating whether the uncorrectable errors are included.

Figure 18:
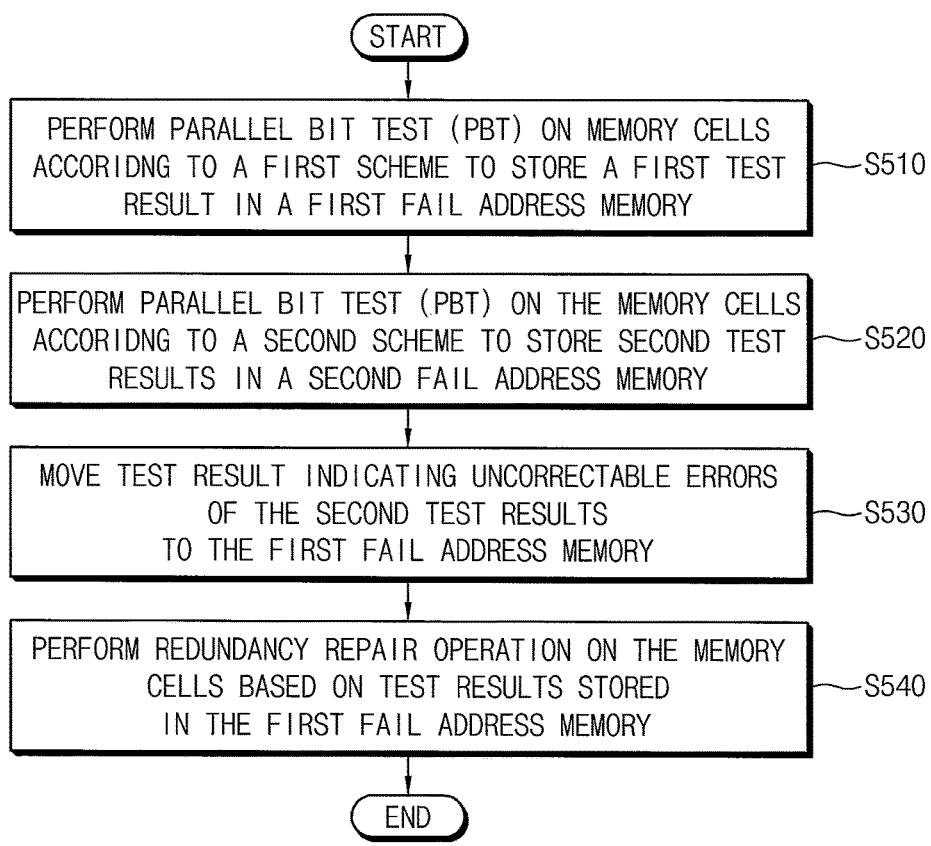
FIGS. 18 and 19 illustrate a method of operating a semiconductor memory device according to at least one example embodiment.
Figure 19:
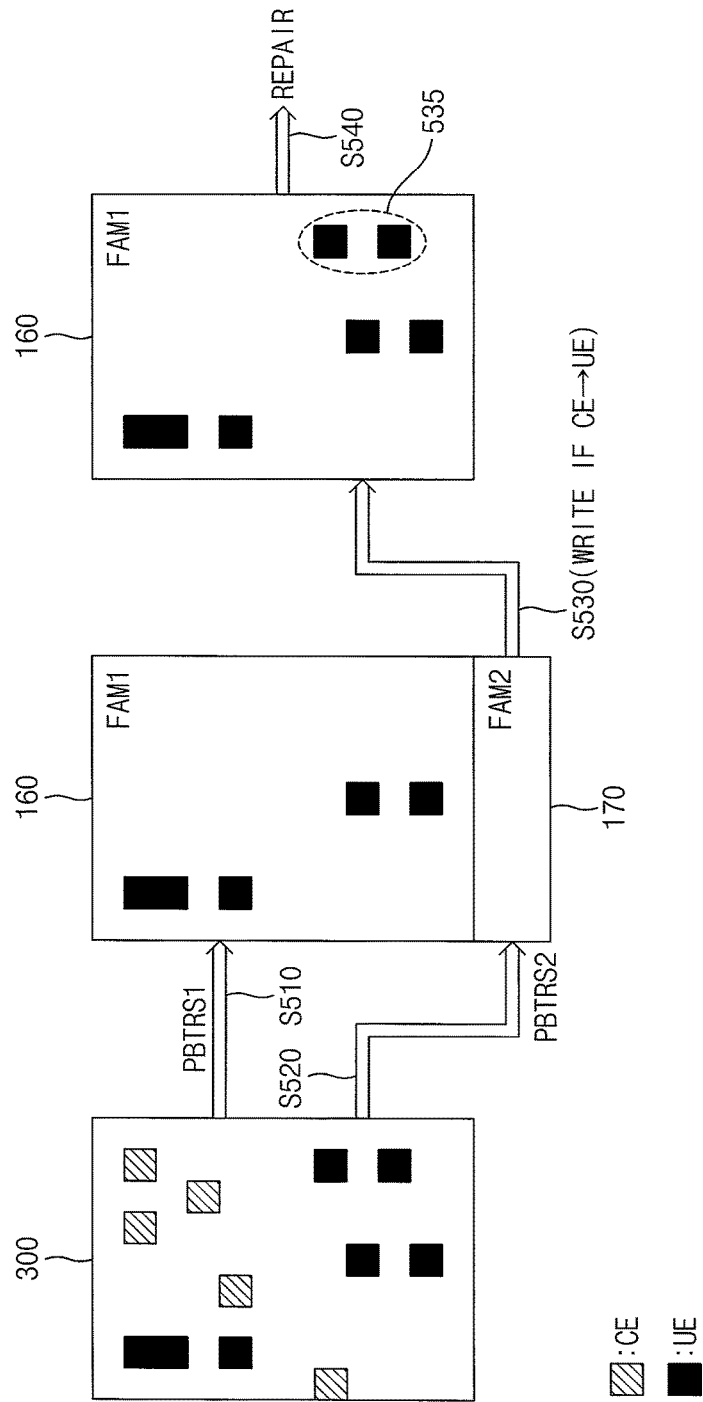

FIGS. 18 and 19 illustrate a method of operating a semiconductor memory device according to example embodiments.

Referring to FIGS. 2 through 19, when the memory cell array 300 includes correctable errors CE which the error correction circuit 360 can correct and uncorrectable errors UE which the error correction circuit 360 cannot correct, the test circuit 450 compares the bits of each first unit in the comparison signal CS to output the first result signal CRS1 and records the first result signal CRS1 in the first fail address memory 160 as the first test result signal PBTRS1 when a number of errors in the first result signal CRS1 indicates the uncorrectable errors UE as a reference numeral S510 indicates. That is, the test circuit 400 performs a parallel bit test (PBT) on memory cells in the memory cell array 300 according to a first scheme and selectively records the first test result signal PBTRS1 in the first fail address memory 160.

As a reference numeral S520 indicates, the test circuit 400 compares corresponding bits in the first units as each second unit to output the second result signal CRS2 and records the first result signal CRS1 and the second result signal CRS2 in the second fail address memory 170 as the second test result signal PBTRS2.

As a reference numeral S530 indicates, the test device 150 marks the correctable errors CE in the second fail address memory 170 and moves the uncorrectable errors in the second fail address memory 170 to the first fail address memory 160 as a reference numeral indicates 535.

As a reference numeral S540 indicates, the test device 150 may control the semiconductor memory device 200 such that the fail cells associated with the uncorrectable errors are repaired by a redundancy repair operation by referring to records in the first fail address memory 160.

In a conventional PBT, since test results are merged on burst length, detected error(s) may not be determined as a single bit error or multi-bit error. In addition, in another conventional PBT, single bit error may be accumulated but time overhead may be increased when a number of fail bits increases. However, according to example embodiments of inventive concepts, when a semiconductor memory device employs an error correction code, test time overhead may be reduced while performing PBT and uncorrectable errors may be prevented from being interpreted as correctable errors.

Figure 20:
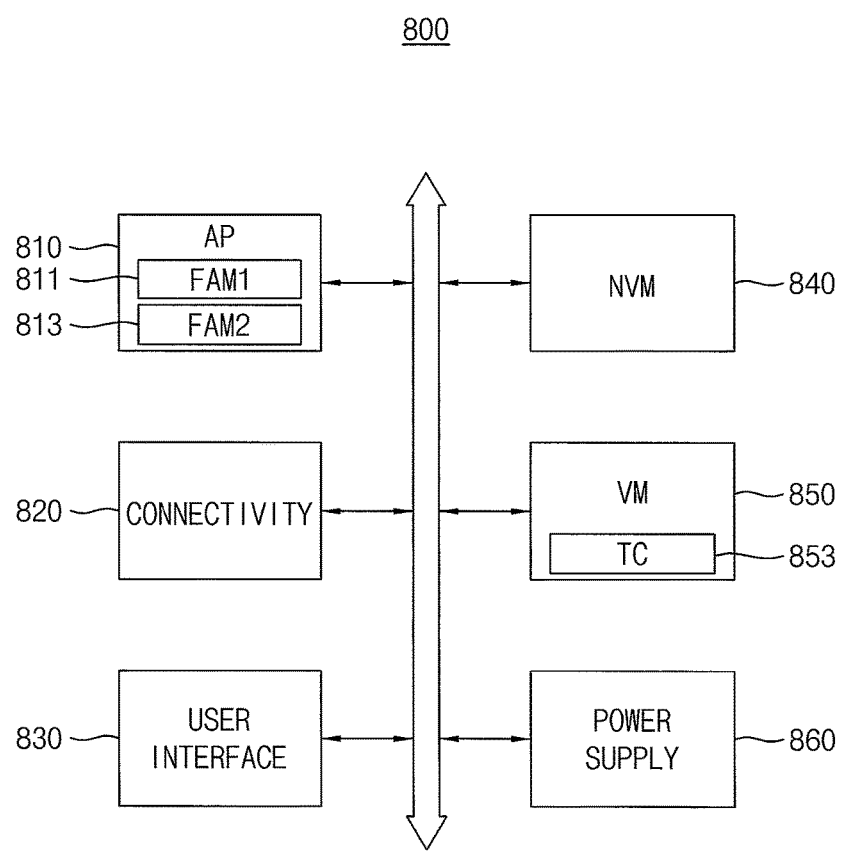
FIG. 20 is a block diagram illustrating a mobile system including the semiconductor memory device according to at least one example embodiment.

FIG. 20 is a block diagram illustrating a mobile system including the semiconductor memory device according to example embodiments.

Referring to FIG. 20, a mobile system 800 may include an application processor 810, a connectivity unit 820, a semiconductor memory device 850, a nonvolatile memory device 840, a user interface 830 and a power supply 860.

The application processor 810 may execute applications, such as a web browser, a game application, a video player, etc. The application processor 810 may include a first fail address memory 811 and a second fail address memory 813. The connectivity unit 820 may perform wired or wireless communication with an external device. The semiconductor memory device 550 may store data processed by the application processor 910 or operate as a working memory. The semiconductor memory device 850 may include a test circuit 853. The semiconductor memory device 850 may employ the semiconductor memory device 200 of FIG. 3. The test circuit 853 may employ the test circuit 400 of FIG. 6.

The nonvolatile memory device 840 may store a boot image for booting the mobile system 800. The user interface 830 may include at least one input device, such as a keypad, a touch screen, etc., and at least one output device, such as a speaker, a display device, etc. The power supply 860 may supply a power supply voltage to the mobile system 800.

In some embodiments, the mobile system 800 and/or components of the mobile system 800 may be packaged in various forms.

Inventive concepts may be applied to systems using semiconductor memory devices. Inventive concepts may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of inventive concepts. Accordingly, all such modifications are intended to be included within the scope of inventive concepts as defined in the claims.

What is claimed is:

1. A memory system comprising:
a semiconductor memory device, the semiconductor memory device including a memory cell array, an error correction circuit and a test circuit; and
a test device configured to control a test of the semiconductor memory device, the test device including a first fail address memory and a second fail address memory,
wherein the test circuit is configured to
perform a first test on the memory cell array to selectively record a first test result associated with the first test in the first fail address memory,
perform a second test on the memory cell array to record a second test result associated with the second test in the second fail address memory, and
perform the first test and the second test based on a test pattern data from the test device in a test mode, and
wherein the test device is configured to repair cells associated with uncorrectable errors by redundancy repair operation by referring to the first fail address memory after a controller records a selected second test result in the first fail address memory, the selected second test result being associated with a number of uncorrectable errors that exceeds an error correction threshold of the error correction circuit.

2. The memory system of claim 1, wherein in the test mode, the test circuit is configured to:
write the test pattern data in the memory cell array, read a first size of the test pattern data as a first size of test result data and compare corresponding bits of the first size of the test result data and the test pattern data, and generate a comparison signal based on the comparison, the comparison signal including first units;
perform the first test by comparing bits of each first unit in the comparison signal while counting a number of errors in the test result data; and
perform the second test by comparing corresponding bits in the first units in the comparison signal as each second unit while comparing the bits of each first unit.

3. The memory system of claim 2, wherein the test circuit is configured to record the first test result as a first test result signal in the first fail address memory if the number of errors exceeds the error correction threshold of the error correction circuit.

4. The memory system of claim 2, wherein the test circuit is configured to
record a first sub result in a first region of the second fail address memory, the first sub result being a result of the comparing the bits of each first unit, and
record a second sub result in a second region of the second fail address memory, the second sub result being a result of the comparing the bits of each second unit.

5. The memory system of claim 4, wherein the test circuit is configured to
compress the first sub result to record a first compressed sub result in the first region and
compress the second sub result to record a second compressed sub result in the second region.

6. The memory system of claim 1, wherein the test device further includes the controller configured to manage the first fail address memory and the second fail address memory, and
wherein the test circuit is configured to
perform the second test on each of a plurality of items and accumulate the second test result to record the accumulated second test result in the second fail address memory.

7. The memory system of claim 6, wherein the controller is configured to record the selected second test result from the accumulated second test result.

8. The memory system of claim 2, wherein the test circuit comprises:
a first buffer that stores the test pattern data;
a second buffer that stores the test result data;
a comparator block configured to compare corresponding bits of the first size of the tests pattern data and the first size of the test result data and output the comparison signal based on the comparison;
an error counter block configured to provide an error signal based on bits of the comparison signal, wherein the error signal indicates whether the number of errors in the test result data exceeds the error correction threshold of the error correction circuit;
a first comparison circuit configured to compare bits of each first unit in the comparison signal to output a first result signal; and
a second comparison circuit configured to compare the corresponding bits in the first units as each second unit to output a second result signal.

9. The memory system of claim 8, further comprising:
a transmission circuit configured to perform an AND operation on the error signal and the first result signal to transmit a first result signal to the test device and configured to transmit the first result signal and the second result signal as a second test result signal to the test device, and
wherein the first test result signal indicates a result of the first test and the second test result signal indicates a result of the second test.

10. The memory system of claim 9, wherein the transmission circuit transmits the first test result signal to the test device only when the error signal indicates that the number of errors in the test result data exceeds the error correction threshold of the error correction circuit.

11. The memory system of claim 9, wherein the test circuit is configured to transmit the error signal, the first test result signal and the second test result signal to the test device through a data output path of the semiconductor memory device.

12. The memory system of claim 1, wherein the memory cell array includes a three dimensional memory cell array.

13. A method of operating a semiconductor memory cell array including a memory cell array and an error correction circuit, the method comprising:
performing a parallel bit test (PBT) on a plurality of memory cells in the memory cell array according to a first scheme to selectively record a first test result in a first fail address memory;
performing a PBT on the plurality of memory cells according to a second scheme to record at least one second test result in a second fail address memory;
recording selected second test result of the at least one second test result in the first fail address memory, wherein the selected second test result is associated with uncorrectable errors exceeding an error correction threshold of the error correction circuit; and
performing a redundancy repair operation on cells of the plurality of memory cells associated with the uncorrectable errors by referring to the first fail address memory.

14. The method of claim 13, wherein the first test result is recorded in the first fail address memory when a number of errors indicated by the first test result exceeds an error correction capability of the error correction circuit.

15. A memory system comprising:
a semiconductor memory device, the semiconductor memory device including,
a memory cell array,
an error correction circuit, and
a test circuit, the test circuit being configured to
receive test pattern data and perform a first test and a second test on the memory cell array based on the test pattern data,
determine a number of errors based on the test pattern data,
identify cells associated with the errors and identify locations of the cells associated with the errors, a first test result of the first test being based on the number of errors and the identified cells and a second test result of the second test being based on the identified cells and identified locations,
perform a redundancy repair operation on cells of the memory cell array associated with uncorrectable errors by referring to the identified cells,
write the test pattern data in the memory cell array, read a first size of the test pattern data as a first size of test result data and compare corresponding bits of the first size of the test result data and the test pattern data, and generate a comparison signal based on the comparison, the comparison signal including first units, and
perform the first test by comparing bits of each first unit in the comparison signal while counting the number of errors in the test result data.

16. The memory system of claim 15, wherein the first units correspond to burst lengths.

17. The memory system of claim 16, wherein the test circuit is configured to perform the second test by comparing corresponding bits in the first units in the comparison signal as each second unit while comparing the bits of each first unit.

18. The memory system of claim 17, further comprising:
a first fail address memory; and
a second fail address memory, wherein
the test circuit is configured to record the first test result as a first test result signal in the first fail address memory if the number of errors exceeds an error correction threshold of the error correction circuit,
the test circuit is configured to record a first sub result in a first region of the second fail address memory, the first sub result being a result of the comparing the bits of each first unit, and the test circuit is configured to record a second sub result in a second region of the second fail address memory, the second sub result being a result of the comparing the bits of each second unit.

* * * * *